(12) United States Patent
Hergenhan et al.

(10) Patent No.: US 7,274,030 B2
(45) Date of Patent: Sep. 25, 2007

(54) APPARATUS FOR THE TEMPORALLY STABLE GENERATION OF EUV RADIATION BY MEANS OF A LASER-INDUCED PLASMA

(75) Inventors: Guido Hergenhan, Jena (DE); Christian Ziener, Jena (DE); Kai Gaebel, Jena (DE)

(73) Assignee: XTREME technologies GmbH, Jena (DE)

( * ) Notice: Subject to any disclaimer, the term of this patent is extended or adjusted under 35 U.S.C. 154(b) by 295 days.

(21) Appl. No.: 11/149,916

(22) Filed: Jun. 10, 2005

(65) Prior Publication Data
US 2005/0274912 A1 Dec. 15, 2005

(30) Foreign Application Priority Data
Jun. 11, 2004 (DE) ............... 10 2004 028 943

(51) Int. Cl.
*H05H 1/00* (2006.01)
(52) U.S. Cl. .................. 250/504 R; 378/119
(58) Field of Classification Search .............. None
See application file for complete search history.

(56) References Cited

FOREIGN PATENT DOCUMENTS

| DE | 103 14 849 | 3/2003 |
|---|---|---|
| DE | 103 06 668 | 8/2004 |
| EP | 0 858 249 | 8/1998 |
| EP | 1 309 234 | 5/2003 |
| WO | WO94/26080 | 11/1994 |

*Primary Examiner*—Jack I. Berman
*Assistant Examiner*—Zia R. Hashmi
(74) *Attorney, Agent, or Firm*—Reed Smith LLP

(57) ABSTRACT

The invention is directed to an apparatus for generating soft x-radiation, particularly EUV radiation, by laser-induced plasma. The object of the invention, to find a novel possibility for generating EUV radiation by means of a laser-induced plasma by which a temporally stable radiation emission in the desired wavelength region is ensured when interacting with the target without active regulation of the laser beam, is met according to the invention in that at least one laser is directed to the target, wherein the laser has at least one defined plane with a highly stable spatial distribution of the power density of the laser, and this defined plane is imaged on the target by an optical imaging system so as to be reduced so that the optical image of the defined plane is active for the plasma generation instead of the laser focus. The invention is applied in exposure machines for semiconductor lithography for spatially stable generation of radiation.

25 Claims, 9 Drawing Sheets

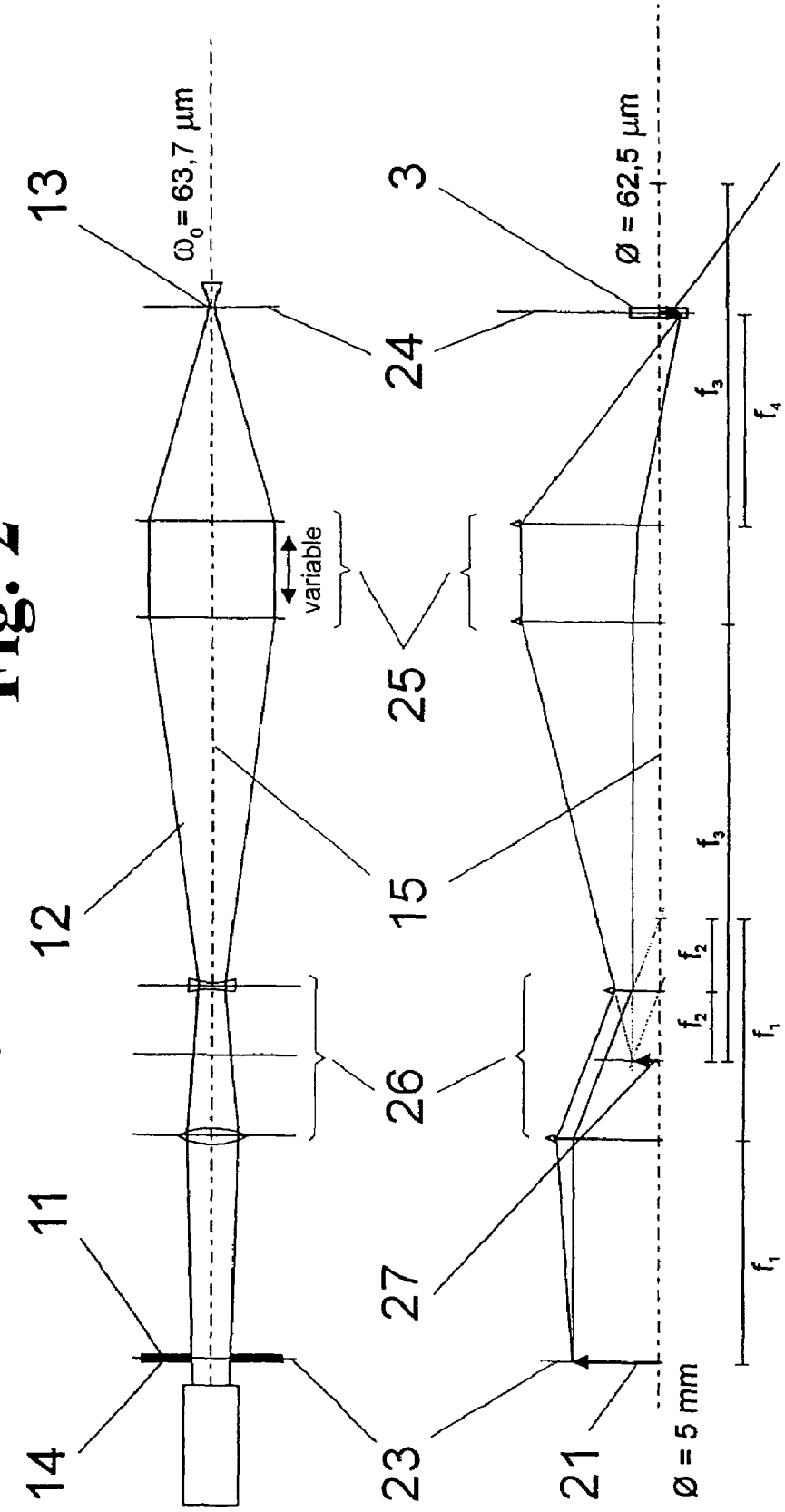

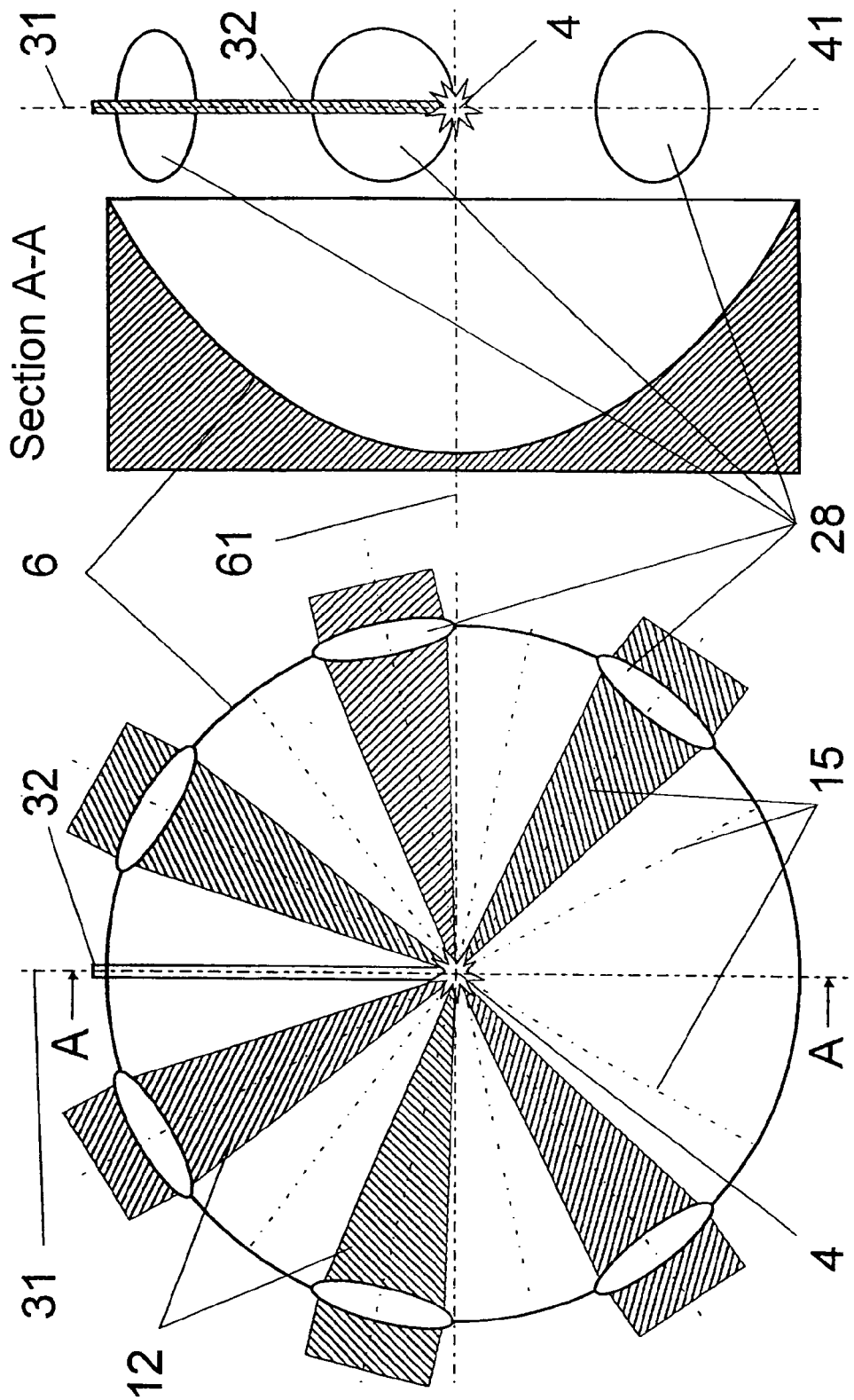

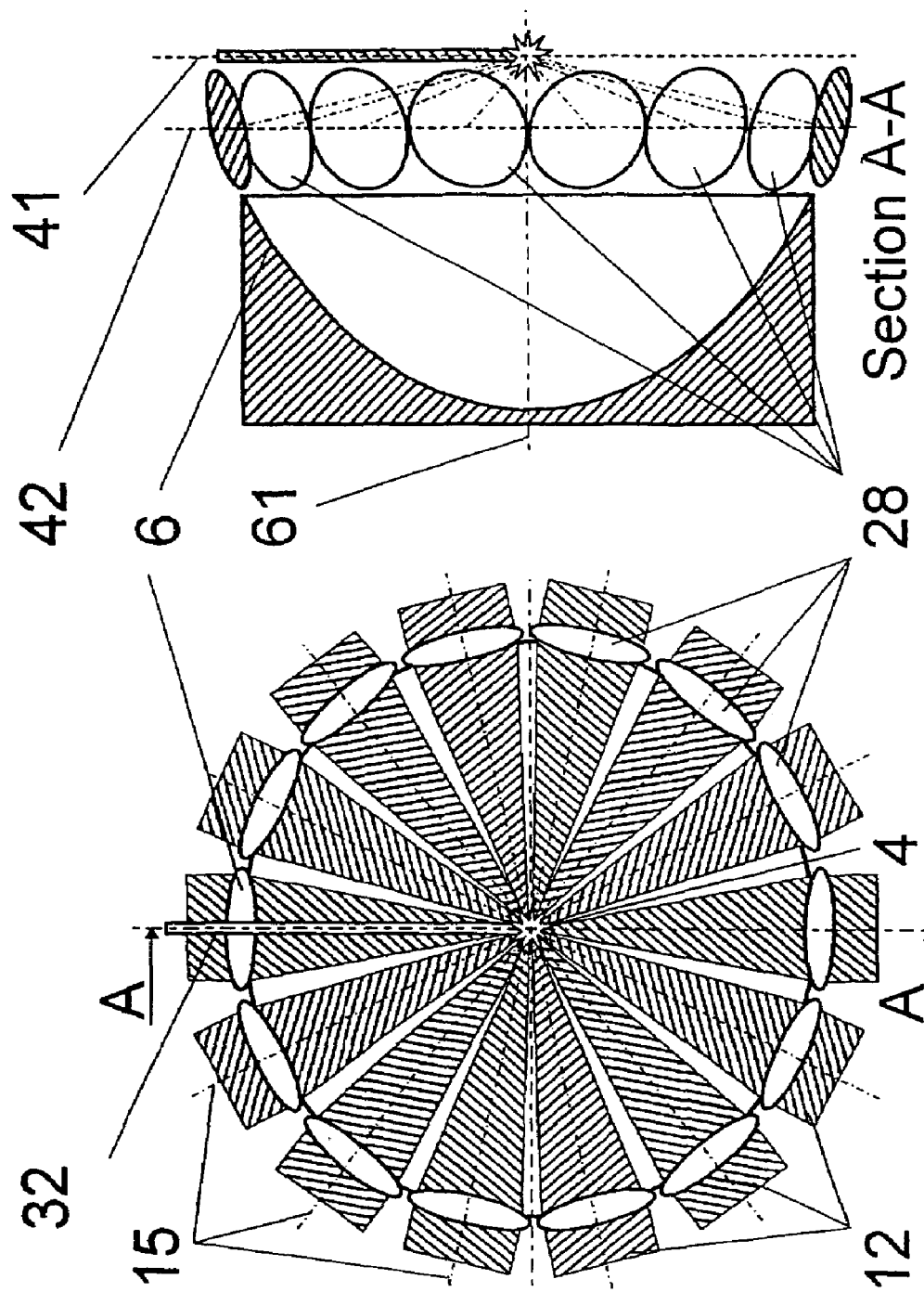

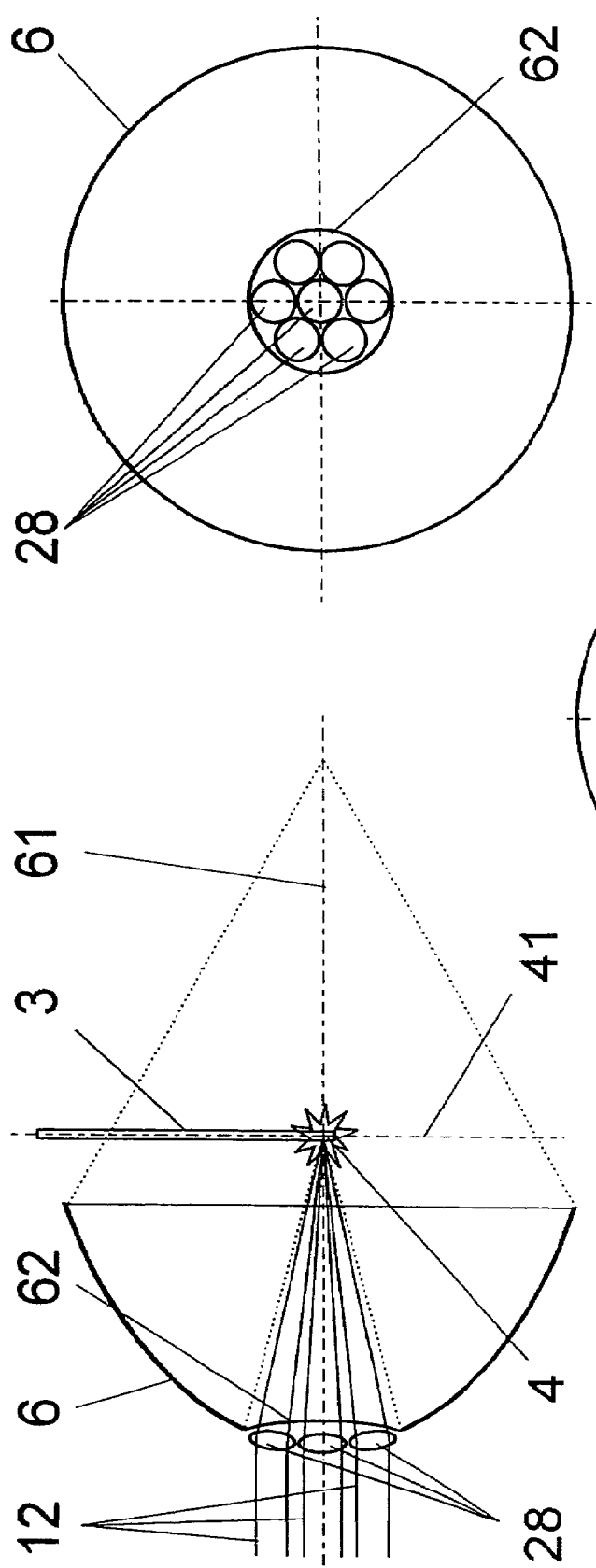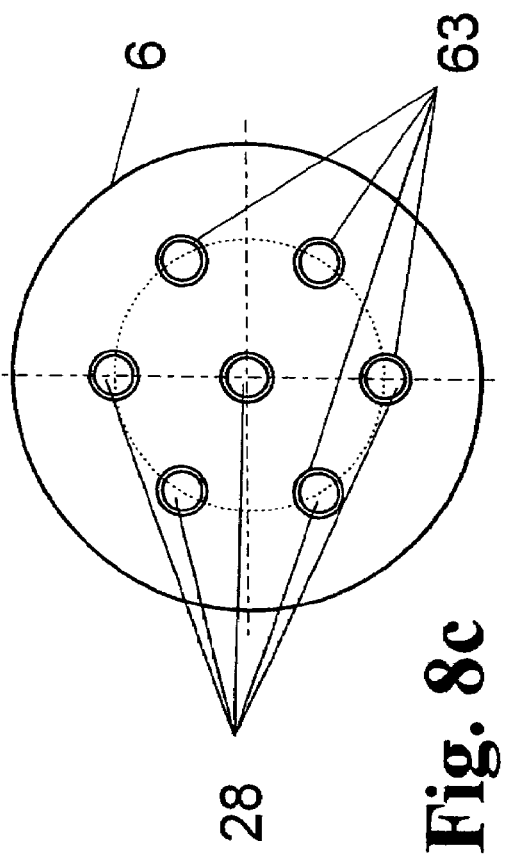
Fig. 8a
Fig. 8b
Fig. 8c

APPARATUS FOR THE TEMPORALLY STABLE GENERATION OF EUV RADIATION BY MEANS OF A LASER-INDUCED PLASMA

CROSS-REFERENCE TO RELATED APPLICATION

This application claims priority of German Application No. 10 2004 028 943.3, filed Jun. 11, 2004, the complete disclosure of which is hereby incorporated by reference.

BACKGROUND OF THE INVENTION a) Field of the Invention

The invention is directed to an apparatus for the generation of soft x-radiation, particularly EUV radiation, by means of a laser-induced plasma. The invention is primarily applied for spatially stable generation of radiation in exposure machines for semiconductor lithography.

b) Related Considerations and Art

Dense, hot plasma that is generated on the basis of a gas discharge or laser excitation can emit EUV radiation under defined excitation conditions. In the latter case, a so-called target is heated by a laser to the point that a significant proportion of the characteristic and temperature radiation coming from it lies in the extreme ultraviolet (EUV) spectral region. The target with a suitable emission characteristic is a stationary material or a continuous or discontinuous flow of material of solid, liquid, gaseous or mixed consistency. These different forms will be referred to hereinafter generally as target.

In practice, fluctuations in the radiating direction and radiating angle of the laser beam result in temporal fluctuations in the EUV emission of the plasma because, when the laser beam varies in direction and radiating angle, these variations are transmitted to the point of interaction with the target and the intensity distribution at this point. However, for many applications, particularly for a radiation source for projection lithography, the emitted radiation output may undergo only small to very small temporal fluctuations in the EUV spectral region.

As a rule, the target must interact with a focused laser beam in order to achieve the most efficient possible generation of short-wavelength electromagnetic radiation in the desired wavelength region. For this purpose, the laser beam generated by the laser system is directed to the target in a focused manner by means of a beam-shaping element such as a lens or a concave mirror.

Fluctuation and drifting of the beam direction and/or radiating angle in laser beams, particularly those coming from a high-power laser, regularly occur primarily as a result of thermal changes. These fluctuations progress into variations in position and in power density at the point of interaction with the target and lead to unwanted fluctuations in the emission of EUV radiation particularly in the case of a target jet.

In order to meet the strict requirements for stability with respect to the position and the output of a radiation source for EUV projection lithography, the interaction point and the interaction surface between the target and laser beam must be maintained stable with respect in time. A known possibility for stabilizing the beam direction of a laser consists in measuring and regulating the beam direction, e.g., by means of a CCD camera as sensor and a micromirror or tilting mirror as actuating member.

A possibility for stabilizing the position of a target flow, e.g., a filament target, jet target or droplet target, is described in Patent Application DE 103 14 849 which has not yet been published. This patent application discloses an arrangement for stabilization having optical sensors for detecting deviations in at least one radiating direction of the target jet or energy beam from an intersection of the two radiating directions that is provided as interaction point. The output signals of the optical sensors are used to align the radiating directions with the interaction point by adjusting and tracking at least one of the radiating directions of the target jet and energy beam in the manner of a control loop. However, regulation of this type is disadvantageous on the whole because it is relatively complicated, requires active adjusting members, and is limited with respect to the speed of regulation.

OBJECT AND SUMMARY OF THE INVENTION

It is the object of the invention to find a novel possibility for generating EUV radiation by means of a laser-induced plasma by which the location and power density distribution of the laser beam can be kept constant with respect to time when interacting with the target without active regulation so as to ensure a temporally stable radiation emission in the desired wavelength range.

In a device for generating soft x-radiation, particularly EUV radiation, in which at least one laser is directed to a target for the generation of a plasma, the above-stated object is met, according to the invention, in that the laser has at least one defined plane which is selected as a plane with a highly stable spatial distribution of the power density of the laser, and in that an imaging system is provided for generating a reduced optical image of the defined plane of stable spatial distribution of the power density of the laser on the target, so that the optical image of the defined plane is active for plasma generation at an interaction point of the target instead of the laser focus.

In an advantageous manner, the exit aperture of the laser medium or the aperture of a special diaphragm of the laser is selected as the defined plane with preferred power density distribution.

At least one target jet, preferably comprising liquid target material in continuous form or as a regular series of droplets, or a target filament of solid material, preferably of frozen target material (e.g., xenon), is advisably used as a target which can be prepared in a reproducible manner.

The imaging system can advisably comprise simple imaging optics with lenses or mirrors. However, the imaging system advantageously comprises a plurality of optical components. It preferably has a Kepler telescope or is constructed in multiple stages, e.g., as a combination of Galileo telescope and Kepler telescope.

For the purpose of an increase in the energy input into the target, it has proven advantageous that the laser with the imaging system is provided as a plurality of equivalent complete laser arrangements for excitation of a target, wherein the laser arrangements have optical axes that are directed to the target at different angles in order to image the respective defined planes on the target from different directions. The optical axes of the laser arrangements can advisably be directed to the interaction point of the target at an obtuse angle or acute angle relative to one another and symmetric to a target axis or target plane.

A collector mirror is advisably provided for collecting and focusing the radiation generated by the plasma at the interaction point. The collector mirror has an optical axis that is oriented orthogonal to a target plane in which the target is prepared in a reproducible manner and penetrates the target plane at the interaction point.

For a general configuration of the kind mentioned above, it has proven advantageous in a first design variant when the optical axes of the laser arrangements are oriented in the target plane symmetrically in pairs to the interaction point, wherein the laser arrangements have imaging optics whose front lenses are arranged along a circular line around the interaction point, and wherein there are gaps between the imaging optics on the circular line so that laser light cannot enter from one laser arrangement into another laser arrangement.

In a second design variant, the optical axes of the laser arrangements are directed to the target as side lines of at least one imaginary cone envelope whose axis of symmetry is coaxial to the optical axis of the collector mirror and whose tip contacts the interaction point, wherein the laser arrangements have imaging optics which are so arranged along a circular line in at least one plane lying outside and parallel to the target plane that the laser light cannot enter a laser arrangement from any other laser arrangement.

This is achieved in an advantageous manner in that the laser arrangements are associated with first imaging optics in one plane and second imaging optics in another plane, wherein the optical axes of the first imaging optics and the optical axes of the second imaging optics are two separate cone envelopes.

This can be realized in that the first imaging optics and second imaging optics are arranged in different parallel planes between the interaction point and the collector mirror, wherein the first imaging optics and second imaging optics are arranged on circular lines with different radii around the optical axis of the collector mirror and their optical axes define cone envelopes with different cone angles. Another advantageous possibility consists in arranging the first imaging optics and the second imaging optics in two planes located parallel to and symmetric to the target plane, wherein gaps are provided alternately between the imaging optics in one plane and between the imaging optics in the other plane along the respective circular line around the optical axis of the collector mirror so that no laser light can enter from one laser arrangement of one plane into a laser arrangement of the other plane, and vice versa.

A third advantageous design variant for target excitation with a plurality of laser beams consists in that the collector mirror has a hole concentrically around its optical axis for passing laser beams of a plurality of laser arrangements, wherein the laser beams are directed by imaging optics through the hole to the interaction point and the imaging optics have a closest sphere packing for minimizing the hole size.

In a modified arrangement, a plurality of laser beams are directed by a common imaging system to the interaction point through the hole that is located concentrically around the optical axis of the collector mirror.

In another useful alternative, the collector mirror has a plurality of asymmetrically arranged holes concentrically around its optical axis for passage of a respective laser beam of a plurality of laser arrangements, wherein the laser beams are directed through the individual small holes to the interaction point by means of respective imaging optics.

In special cases, e.g., with two-dimensional or cylindrical target material, it proves advantageous that a plurality of lasers are associated with a common or shared imaging system, wherein separate optical images of the defined planes of the laser that are arranged around a common optical axis of the imaging system are generated as closely adjacent laser spots on the target.

The essence of the invention resides in the selection of a plane in the laser with the best possible spatially stable power density distribution and the imaging of this plane on the target 3 by means of an imaging system (with optical elements such as lenses or mirrors) because the image of this power density distribution is also stationary, has a constant size and power density distribution, and is not dependent upon variations in the radiation direction or radiation angle (divergence) of the laser beam 12.

With the solution according to the invention it is possible to generate EUV radiation by means of a laser-induced plasma such that the location of and power density distribution of the laser beam at the point of interaction with the target are maintained constant with respect to time without active regulation so as to ensure a temporally stable radiation emission in the desired wavelength region.

Further, through the impingement of laser light from a plurality of laser arrangements according to the invention upon a target, it is possible on the one hand to increase the laser output on the target and, on the other hand, to homogenize the radiation characteristic of the EUV emission from the plasma or optimize it with respect to the specific application.

The invention will be described more fully in the following with reference to embodiment examples.

BRIEF DESCRIPTION OF THE DRAWINGS

In the drawings:

FIG. 2 is a schematic view of the Gaussian bundle of the laser light with imaging of the laser outlet opening by means of two telescopes;

FIG. 3 is a schematic view showing the imaging of the laser outlet opening with the same construction as that shown in FIG. 2 in a geometric optics diagram;

FIG. 6*a* shows a top view of a collector mirror with a target jet shown in front of it and a plurality of laser arrangements in the target plane;

FIG. 6*b* shows a sectional view corresponding to FIG. 6*a*;

FIG. 7*a* is a top view of a collector mirror with target jet shown in front of it and a plurality of laser arrangements that are directed to the interaction point from at least one plane parallel to the target plane;

FIG. 7*b* is a sectional view corresponding to FIG. 7*a* for a configuration in which all laser arrangements are arranged in a parallel plane other than the target plane;

FIG. 8a shows a side view for another simultaneous excitation of a target with a plurality of laser arrangements according to the invention through a central hole in the collector mirror;

FIG. 8b shows a top view for a simultaneous excitation of a target according to FIG. 8a;

FIG. 8c shows a top view for a simultaneous excitation of a target with a plurality of laser arrangements according to the invention through a plurality of holes in the collector mirror.

DESCRIPTION OF THE PREFERRED EMBODIMENTS

Figure 1:
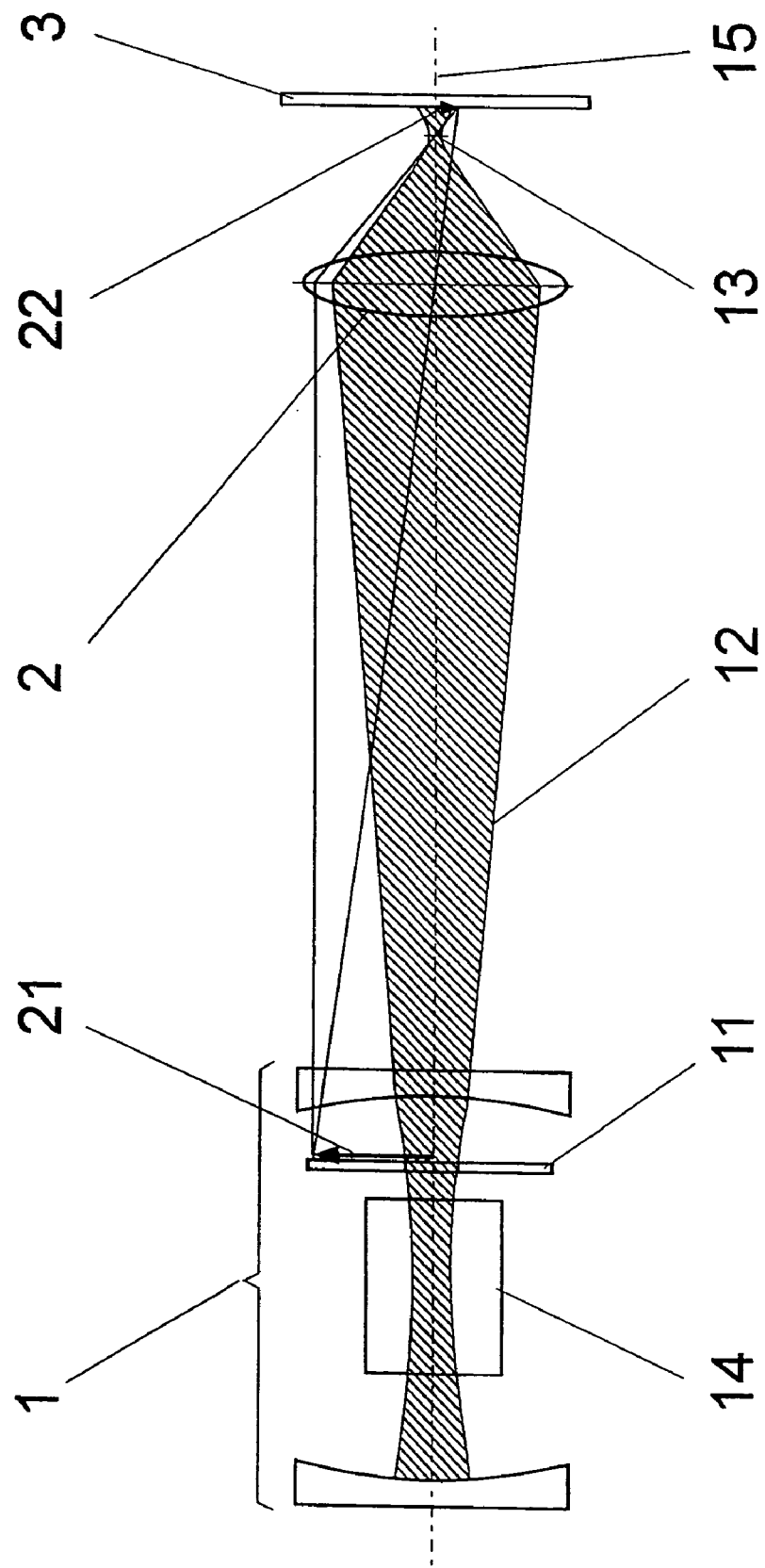
FIG. 1 is a schematic view of the arrangement according to the invention with optical imaging of the laser outlet opening onto the target.

In its basic construction, the invention comprises a laser 1, an optical imaging system 2, and a preferably cylindrical target 3 that is prepared in a reproducible manner, e.g., a filament, liquid jet, or quasi-continuous series of droplets, or the like. The laser 1 is constructed in such a way that it has, in the vicinity of the beam outlet, a fixed plane in which the spatial distribution of the power density of the laser radiation is permanently constant, wherein any temporal changes resulting from pulsed operation of the laser 1 are not taken into consideration.

The starting point of the invention is a rigid connection of a laser 1 (including all of its mechanical and optical components) with a device containing the point of interaction between the target 3 and the laser beam 12 (vacuum chamber, not shown). In practice, variations in the radiating angle and radiating direction of the laser beam 12 that can be traced back, e.g., to thermal changes within the laser-active medium 14 occur in spite of a stable fixing of the optical components in the laser 1.

As a rule, within or in the vicinity of the optical arrangement of the laser 1 there are planes perpendicular to the optical axis in which a spatially fixed distribution of the power density of the laser beam 12 is provided. This can be defined, for example, by determined diaphragms 11 in the beam path or by the aperture of the laser medium 14 itself. For a constant beam output in the image plane 22, the aperture of the beam-shaping element of the imaging system 2 must be designed in such a way that the laser beam 12 is not cut off during fluctuations in the radiating direction and radiating angle.

In order to provide the power density of the laser beam 12 necessary for efficient radiation from the plasma in the desired wavelength region, the plane of the spatially fixed distribution of the power density in the laser system 1, hereinafter object plane 23, must be normally imaged in a reduced manner. This kind of imaging can take place in one step by means of a beam-shaping element, as is shown in FIG. 1, or by means of a telescope. The imaging of the object plane 21 (the diaphragm 11) can be carried out in a plurality of steps as will be described, e.g., with reference to FIGS. 2 and 3 by means of two or more real or virtual intermediate images so that overly long optical paths need not be tolerated for the sake of a high reduction factor. In general, as imaging system 2, beam-shaping elements such as lenses and/or curved mirrors are arranged in such a way that a spatially fixed intensity distribution within the laser 1 is imaged in a reduced manner in the plane lying orthogonal to the laser beam 12 and containing the interaction point of the target 3 and laser beam 12.

In the simplified variant according to FIG. 1, the imaging system 2, as optical lens, is arranged in such a way that a reduced image 22 of the power density distribution in the plane at the beam outlet of the laser 1, which in this case is in the form of the diaphragm 11 as object 21 of the image, is formed by the imaging system 2 in the plane of the interaction between the laser beam 12 and the target 3. The optical imaging is illustrated by an arrow pointing upward, which symbolizes the object 21, a parallel beam and a center beam, and an arrow pointing downward which symbolizes the image 22 of the diaphragm 11. The laser beam 12 shown in the shaded area represents the Gaussian bundle which has 90% of the laser output in cross section. Generally (in imaging systems 2 projecting reduced images), the image 22 of the diaphragm 11 appears behind the focus 13 of the laser beam 12 so that this fact must be taken into account when setting up the laser 1 relative to the target 3.

FIG. 2 likewise shows an optical image in which a diaphragm 1, as spatially fixed intensity distribution of the laser 1, is imaged from the object plane 23 in the image plane 24 in which the point of interaction 4 with the target 3 is located using a Kepler telescope 25. This has the advantage that the image plane 24 lies in the focus 13 of the laser beam 12.

For a high reduction factor, as is shown in FIG. 2, a reduced intermediate image 27 is initially generated in the Galileo telescope 26. The image 22 of the diaphragm 11 on the target 3 results from the reduction of the Galileo telescope 26 (assuming a factor of 4 in the present case) and from the reduction of the Kepler telescope 25 (with a factor of 20 in this example) with a total reduction of 80:1, for example.

While FIG. 2 shows the Gaussian bundle of the laser beam 12, the optical imaging is shown in FIG. 3—in direct analogy to the optics construction of the imaging system 2 shown in FIG. 2—as a geometric optics diagram. The diaphragm 11, as object 21 in the object plane 23, is imaged by the Galileo telescope 26 with intermediate image 27 and by the Kepler telescope 25 in the image plane 24 which is penetrated orthogonally by the optical axis 15 in the focus 13 of the laser beam 12 and in which a reversed, reduced image 22 of the diaphragm 11 is formed as is shown in a stylized manner.

Figure 4:
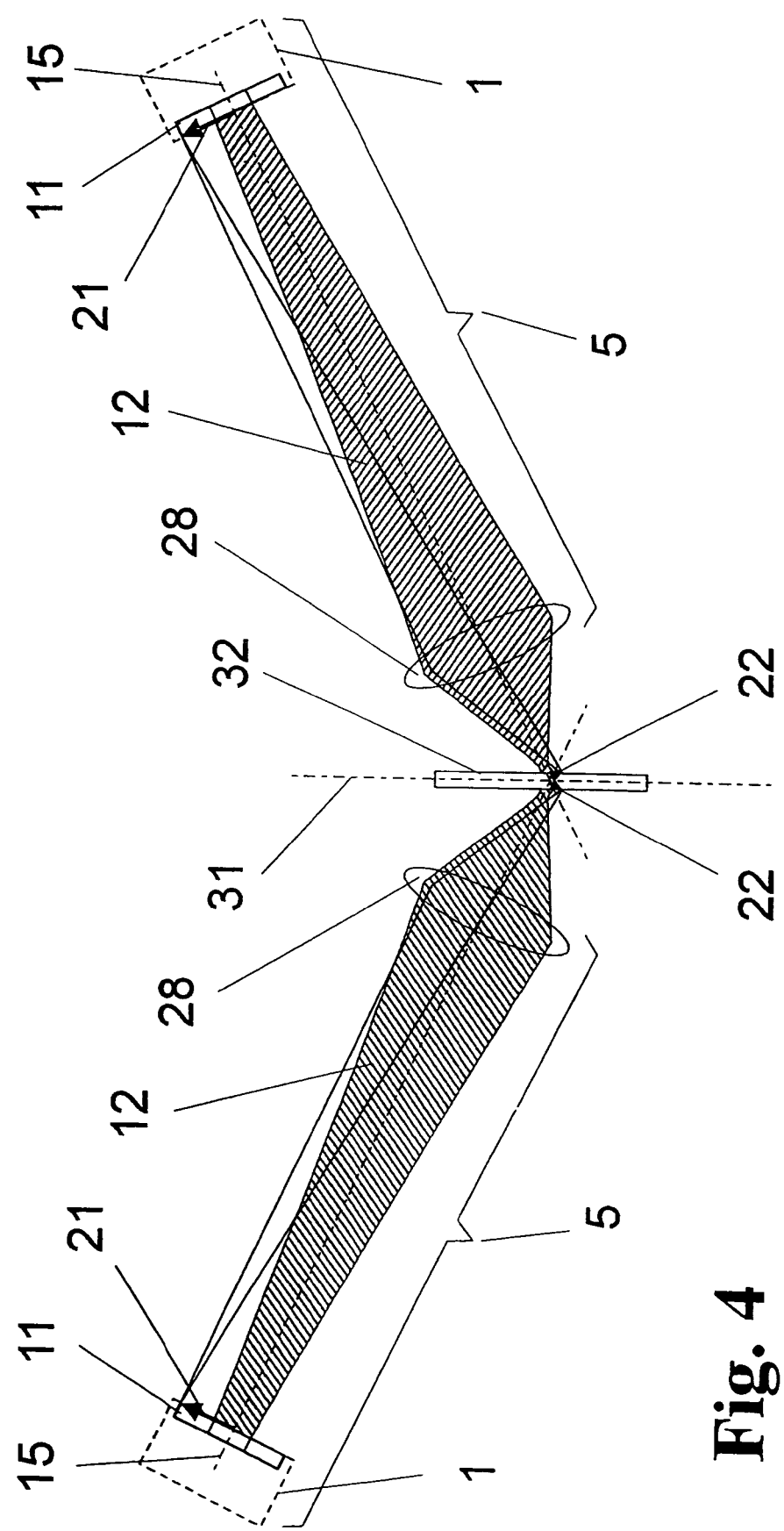
FIG. 4 shows a variant of the invention with two laser imaging systems according to the invention which radiate axially symmetric to the target axis relative to a cylindrically shaped target.

In the constructional variant according to FIG. 4, two laser arrangements 5, shown in a stylized manner as laser 1 with diaphragm 11 and an imaging system 2 which is constructed as simple imaging optics 28 (shown as an individual lens in FIG. 1), are directed onto the target 3 with their optical axes 15 at an obtuse angle relative to one another.

The target 3, in the present case a cylindrical target jet 32 of a material that can be prepared in a reproducible manner (also known as a regenerable target), is struck by the laser beams 12 from different directions distributed around the target axis 31 and at equal (acute) angles to the target axis 31. The directions of the optical axes 15 of the laser arrangements 5 differ from one another to the extent that laser light from one of the laser arrangements 5 cannot enter the imaging optics 28 of the other arrangement 5.

In the example of multiple excitation with two laser beams 12 shown in FIG. 4, both laser arrangements 5 lie with the target axis 31 in a target plane 41 corresponding to the drawing plane.

In multiple arrangements of equivalent laser arrangements 5 for high-energy excitation of a target 3, the position of the individual laser spots relative to one another is generally subject to very exacting tolerances. Therefore, a high level of stability with respect to the size and position of the laser beams 12 on the target 32 is required. By means of the inventive optical imaging of a plane with constant spatial distribution of the power density of the laser radiation (object plane 21) by means of an imaging system 2, this stability of the laser beams 12 with respect to size and position is maintained automatically and (particularly with a telescope, preferably a combination of Kepler telescope 25 and Galileo telescope 26 according to FIGS. 2 and 3) in a stable manner. By means of this type of multiple excitation with laser beams 12 which contribute stable excitation equally to the target jet 32 without the need for regulation, it is actually possible in practice for the first time to generate a homogeneously emitting plasma by simultaneous excitation with a plurality of stably imaged laser spots.

Figure 5:
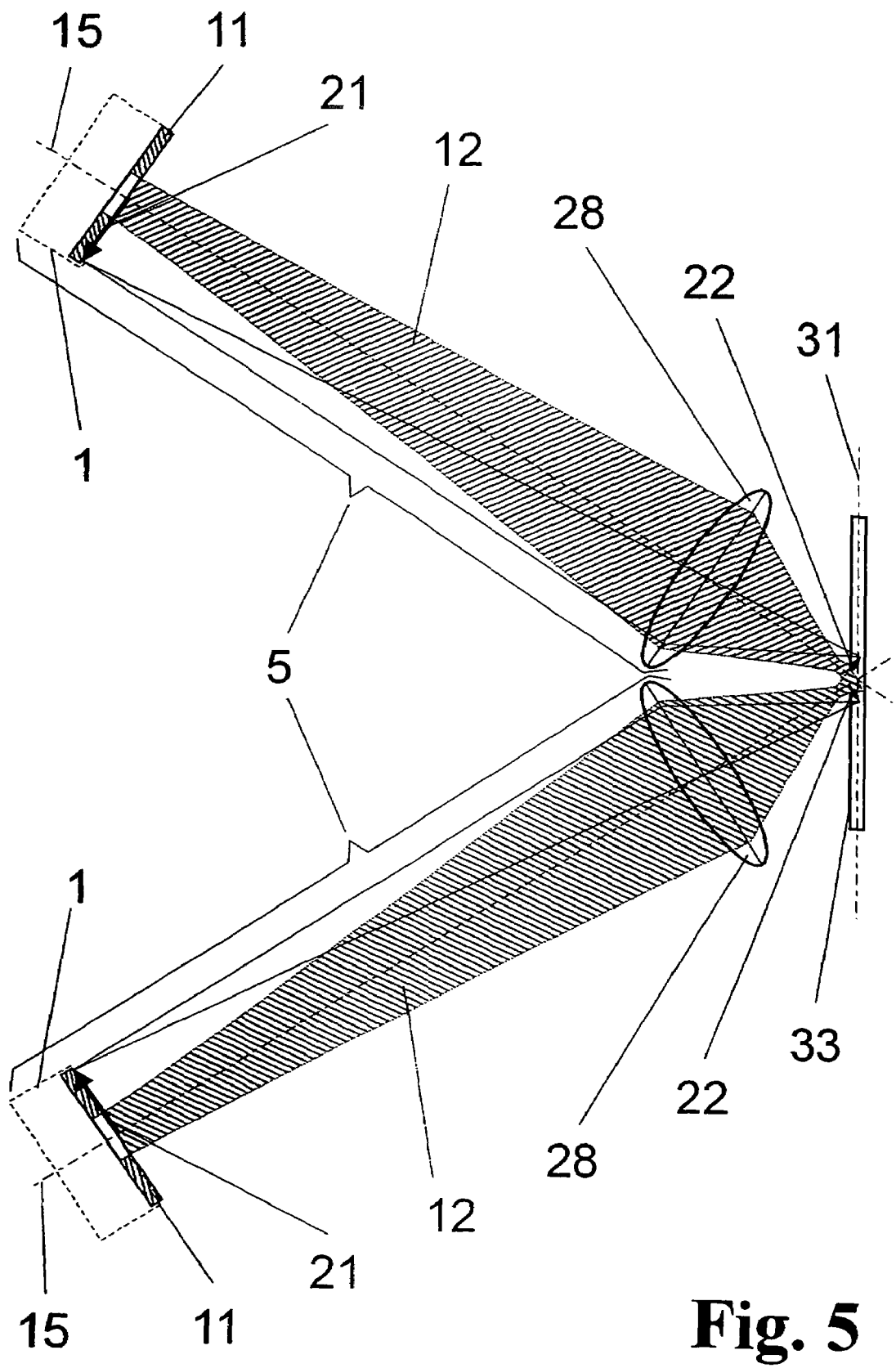
FIG. 5 shows an embodiment form with two laser imaging systems according to the invention which are arranged at different angles to the target axis relative to a cylindrically shaped target.

In FIG. 5, two laser beams 12 are directed simultaneously to a target filament 33 (solid target or frozen xenon jet), preferably for power scaling of the plasma excitation. The laser arrangements 5 lie on one side of the target (i.e., in a half-space with reference to the target flow) and their optical axes 15 have an angle of $0°<\alpha<180°$ relative to one another. The requirements with respect to the position and size of the laser beams 12 are met again by means of an optical imaging by imaging systems 2 of the two defined laser outlet planes (e.g., object plane 21 of a diaphragm 11 or of the aperture of the laser medium 14 according to FIG. 1).

Two laser beams 12 of equivalent laser arrangements 5 are directed to the target filament 33, and the object 21—as planes with a constant spatial distribution of the power density that are selected through the diaphragms 11—is imaged on the point of interaction 4 with the target filament 33. Two laser spots 17 are formed on the target filament 33 as images 22 of the diaphragms 11 which have a well-defined position relative to one another, i.e., substantially cover one another. An arrow shown as object 21 and an oppositely directed arrow shown as image 22 of the diaphragm 11 illustrate the imaging of the diaphragms 11 in the object planes 23 on the target filament 33.

The described arrangement is particularly advantageous when two or more laser beams 12 are directed to the target 3, for example, in order to increase the laser radiation output on the target 3 (FIG. 5) or to optimize the characteristic of the radiation from the plasma (FIG. 4). This concerns not only the positional stability of the laser beams 12 and target 3, but also the positional stability of the laser beams 12 relative to one another at the interaction point 4. This is likewise ensured by the use of the imaging of the diaphragms 11 insofar as the latter are located in a fixed position relative to one another.

FIG. 6 shows a multiple excitation with more than two laser beams 12 in which the equivalent laser arrangements 5 comprising laser 1 and imaging system 2 are represented schematically by a laser beam 12 that is bundled by imaging optics 28. The viewing direction with respect to the general arrangement according to FIG. 6a is a top view of a collector mirror 6 for the beam emitted from the plasma which—as can be seen from the side view in FIG. 6b—is arranged as a concave mirror (ellipsoidal mirror or parabolic mirror) behind the general arrangement for laser excitation.

The laser arrangements 5 which are identical in construction are arranged in a circle around the interaction point 4 in the target plane 41 in which the target axis 31 is also located. All of the laser arrangements 5 form different angles with the target axis 31, and a gap of at least the size of imaging optics 28 of the laser arrangements 5 is always left open across from the interaction point 4 (location of the plasma) in order to prevent laser light from entering from one laser arrangement 5 into another. This is carried out in the present configuration in that the imaging optics 28 are arranged on the circle around the interaction point 4 beginning from the entrance of the target jet 32 in pairs in a mirror-symmetric manner relative to the target axis 31 with a gap in each instance of the size of a laser arrangement 5. Further, gaps are left open in the circle of laser arrangements 5 around the target axis 31 for the entry, and for unused remainders, of the target jet 32.

FIG. 7, which comprises four parts, shows other design variants for a multiple excitation with a plurality of laser arrangements 5 according to the invention.

FIG. 7a shows imaging optics 28 with laser beams 12 which are focused on the interaction point 4 and projected by laser arrangements 5, shown schematically, whose imaging optics 28 are arranged in a circle without gaps. At the same time, the circle illustrates the collector mirror 6 which is located behind it and whose optical axis 61 is intersected by the target axis 31 and accordingly predetermines the interaction point 4 to which all of the optical axes 15 of the laser arrangements 5 are directed. In this case, the imaging optics 28 which are oriented with their optical axes 15 on the interaction point 4 lie in a plane 42 that is arranged parallel to the target axis 31 and orthogonal to optical axis 61 of the collector mirror 6. When the imaging optics 28 of the laser arrangements 5 are arranged without gaps, no laser light from a laser arrangement 5 can enter the imaging optics 28 of another laser arrangement 5 on the one hand and no gaps are required in the circle of the imaging optics 28 of the laser arrangements 5 for the entrance and exit of the target jet 32 on the other hand.

Figure 7C:
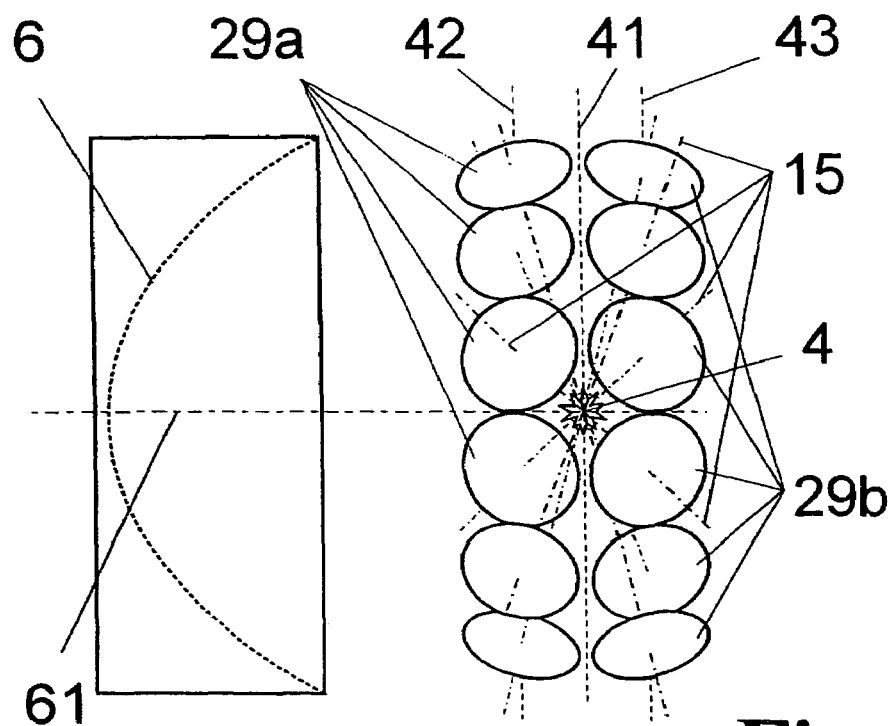
FIG. 7*c* shows a side view corresponding to FIG. 7*a* for a configuration differing from that shown in FIG. 7*b*, in which the laser arrangements are arranged in two parallel planes symmetric to the target plane.

In another construction according to FIG. 7c, in which the top view appears exactly as in FIG. 7a, the laser arrangements 5 are alternately arranged in two different planes 42 and 43, respectively. The interaction point 4 lies between these two planes 42 and 43. The laser arrangements 5 of one plane 42 are represented by imaging optics 29a and those of the other plane 43 are represented by imaging optics 29b (in contrast to FIG. 7a in which the laser arrangements 5 were shown as unified imaging optics 28).

Referring to the side view in FIG. 7c, the actual orientation of the optical axes 15 of the imaging optics 29a and 29b is shown along two different cone envelopes whose cone tips are directed opposite to one another to the interaction point 4. Accordingly, none of the optical axes 15 of the imaging optics 29a or 29b are oriented identically to or parallel with another, so that laser light from one laser arrangement 5 cannot enter another laser arrangement 5. Because of the symmetric arrangement of the laser arrangements 5 with reference to the target plane 41, i.e., actually with reference to the target axis 31 (not designated by reference number in the present view), the position of these laser arrangements 5 being defined by the piercing points of the optical axes 15 through the imaging optics 29a and 29b, the target 3 is excited in this case in a virtually homogenous manner spatially.

Figure 7D:
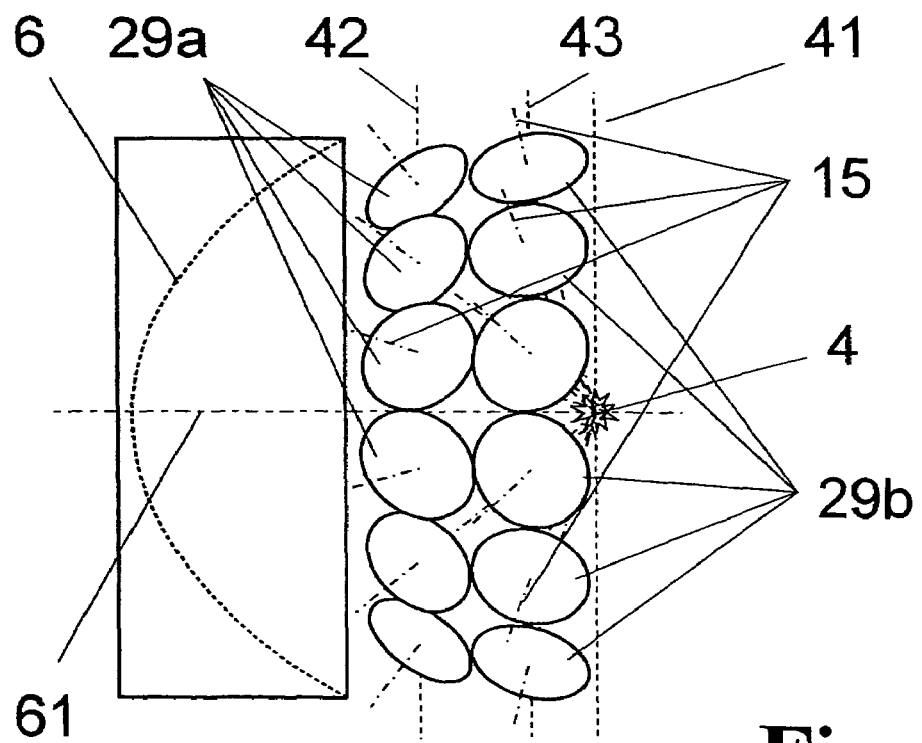
FIG. 7*d* shows a side view corresponding to FIG. 7*a* for a configuration differing from that shown in FIG. 7*b*, in which the laser arrangements are arranged in two different parallel planes on one side of the target plane.

FIG. 7d shows another design, of which FIG. 7a shows a top view. However, as is described in FIG. 7b, no gaps are required on the circle. As in FIG. 7c, the laser arrangements 5 are represented in the different planes 42 and 43 by imaging optics 29a and 29b, respectively.

In this case, the imaging optics 29a and 29b in the parallel planes 42 and 43, respectively, are arranged between the interaction point 4 and the collector mirror 6. Imaging optics 29a lie in plane 42 and imaging optics 29b lie in plane 43 on circular lines with different radii around the optical axis 61 of the collector mirror 6, and their optical axes 15 define cone envelopes with different cone angles.

FIG. 7d differs from FIG. 7c in that the target excitation in the interaction point 4 is optimized (although not homogeneous). The excitation optimization is tailored to the position of the collector mirror 6. Further, it is advantageous compared with FIG. 7c in that the imaging optics 29a and 29b can be arranged without gaps in each of the planes 42 and 43 without laser light being able to enter from one laser arrangement 5 into another. To this extent, FIG. 7d represents a "doubled" excitation variant with respect to FIG. 7b.

Another arrangement for multiple excitation through equivalent laser arrangements 5 with optical imaging is shown in FIG. 8. As can be seen in the top view according to FIG. 8a, the imaging optics 28 are arranged with a high level of packing density in order to direct the focused bundle of laser beams 12 through a hole 62 in the collector mirror 6 to the interaction point 4 of the target 3. However, the odd number of laser arrangements 5 used in this configuration can also be directed to the interaction point 4—so as to be spread apart symmetric to the center—through individual holes 63 in the collector mirror 6 as is illustrated in a top view in FIG. 8c analogous to FIG. 8b in order to achieve a homogeneous plasma excitation of the target 3.

Figure 9:
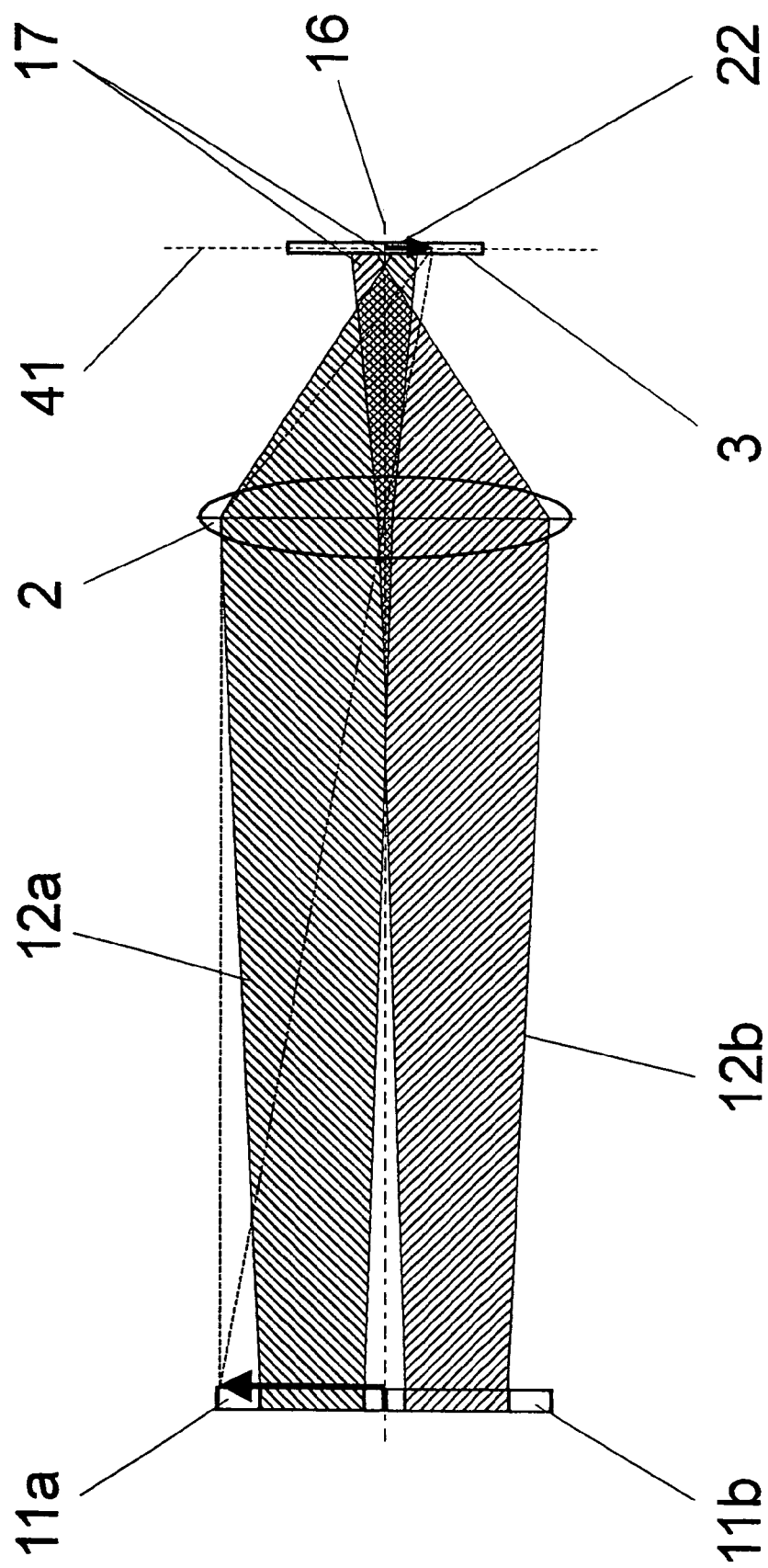
FIG. 9 shows a schematic view for a simultaneous excitation of a target with a plurality of laser arrangements according to the invention which are directed to different regions of the target by means of common imaging optics.

Finally, it should also be noted that a plurality of laser beams can be imaged on a target 3 by a common imaging system 2. This possibility is shown in FIG. 9 for two laser beams 12a and 12b. For this purpose, the planes of spatially constant intensity distribution, as diaphragms 11a and 11b (or, equivalently, the aperture of the laser medium 14) of a plurality of identical lasers 1, are imaged by means of a common imaging system 2 as separate laser spots 17 on a plurality of adjacent locations on the target 3 around the common optical axis 16 so that a well-defined power density distribution, e.g., a succession or close packing of laser spots 17, is achieved on the target 3.

Of course, this configuration of laser beams 12a and 12b shown in FIG. 9 can also be arranged, e.g., for two-dimensional excitation of a two-dimensional target 3, multiple times around the common optical axis 16, i.e., for example, so as to be rotated around the common optical axis 16 once by 90° or twice by 60°.

This latter variant for generating two-dimensional arrangements of laser spots 17 can also be realized as a combination of the construction of the collector mirror 6 of FIGS. 8a and 8b with a common imaging system 2; the target axis 31 of FIG. 8a is then considered as a target plane 41 which is formed, for example, by a target film or by a plurality of successive target jets adjacent to one another.

While the foregoing description and drawings represent invention, it will be obvious to those skilled in the art that various changes may be made therein without departing from the true spirit and scope of the prevent invention.

What is claimed is:

1. An apparatus for generating soft x-radiation, particularly EUV radiation, in which at least one laser is directed to a target for the generation of a plasma, comprising:
    a laser having at least one defined plane which is selected as a plane with a highly stable spatial distribution of power density of the laser; and
    an imaging system provided for generating a reduced optical image of the defined plane of the stable spatial distribution of the power density of the laser on the target, so that an optical image of the defined plane is active for plasma generation at a point of interaction between the laser beam and the target instead of the laser focus.

2. The apparatus according to claim 1, wherein the defined plane with homogeneous power density distribution is the exit aperture of the laser medium.

3. The apparatus according to claim 1, wherein the defined plane with homogeneous power density distribution is the aperture of a special diaphragm of the laser.

4. The apparatus according to claim 1, wherein the target is a target jet.

5. The apparatus according to claim 4, wherein the target is a continuous target jet of liquid target material.

6. The apparatus according to claim 4, wherein the target is a target jet from a regular series of liquid droplets.

7. The apparatus according to claim 1, wherein the target is a target filament.

8. The apparatus according to claim 1, wherein said target is of frozen target material.

9. The apparatus according to claim 1, wherein the imaging system comprises simple imaging optics.

10. The apparatus according to claim 1, wherein the imaging system comprises a plurality of optical components.

11. The apparatus according to claim 10, wherein the imaging system has a Kepler telescope.

12. The apparatus according to claim 10, wherein the imaging system has a Kepler telescope and a Galileo telescope.

13. The apparatus according to claim 1, wherein the laser and imaging system are provided as a plurality of equivalent complete laser arrangements for excitation of a target, wherein the laser arrangements have optical axes that are directed to the target at different angles in order to image the respective defined planes on the target from different directions.

14. The apparatus according to claim 13, wherein the optical axes of the laser arrangements are directed to the interaction point of the target at an obtuse angle relative to one another and symmetric to a target axis.

15. The apparatus according to claim 13, wherein the optical axes of the laser arrangements are directed to the interaction point of the target at an acute angle relative to one another and symmetric to an axis orthogonal to the target axis.

16. The apparatus according to claim 13, wherein in that a collector mirror is provided for collecting and focusing the radiation generated by the plasma at the interaction point, the collector mirror having an optical axis that is oriented orthogonal to a target plane in which the target is prepared in a reproducible manner and penetrates the target plane at the interaction point.

17. The apparatus according to claim 16, wherein the optical axes of the laser arrangements are oriented in the target plane symmetrically in pairs to the interaction point, wherein the laser arrangements have imaging optics which are arranged along a circular line around the interaction point, and there are gaps between the imaging optics on the circular line so that laser light cannot enter from one laser arrangement into another laser arrangement.

18. The apparatus according to claim 16, wherein the optical axes of the laser arrangements are directed to the target as side lines of at least one imaginary cone envelope whose axis of symmetry is coaxial to the optical axis of the collector mirror and whose tip contacts the interaction point, wherein the laser arrangements have imaging optics which are so arranged along a circular line in at least one plane lying outside of and parallel to the target plane that laser light cannot enter a laser arrangement from any other laser arrangement.

19. The apparatus according to claim 18, wherein the laser arrangements are associated with first imaging optics in one plane and with second imaging optics in another plane, wherein the optical axes of the first imaging optics and the optical axes of the second imaging optics define two separate cone envelopes and meet in the interaction point in such a way that laser light cannot enter a laser arrangement from any other laser arrangement.

20. The apparatus according to claim 19, wherein the first imaging optics and second imaging optics are arranged in different parallel planes between the interaction point and the collector mirror, wherein the first imaging optics and second imaging optics are arranged on circular lines with different radii around the optical axis of the collector mirror and their optical axes define cone envelopes with different cone angles.

21. The apparatus according to claim 19, where in the first imaging optics and the second imaging optics are arranged in two planes lying parallel to and symmetric to the target plane, wherein gaps are provided alternately between the imaging optics in one plane and between the imaging optics in the other plane along the respective circular line around the optical axis of the collector mirror so that no laser light can enter from one laser arrangement of one plane into a laser arrangement of the other plane, and vice versa.

22. The apparatus according to claim 16, wherein the collector mirror has a hole concentrically around its optical axis for passing laser beams of a plurality of laser arrangements, wherein the laser beams are directed via imaging optics through the hole to the interaction point and the imaging optics have a closest sphere packing for minimizing the hole size.

23. The apparatus according to claim 16, wherein the collector mirror has a hole concentrically around its optical axis for passing laser beams of a plurality of lasers, wherein the laser beams are directed through the hole to the interaction point via a common imaging system.

24. The apparatus according to claim 16, wherein the collector mirror has a plurality of holes arranged in an axially symmetric manner concentrically around its optical axis for passing a laser beam, wherein the laser beams are directed through the holes to the interaction point via imaging optics.

25. The apparatus according to claim 1, wherein a plurality of lasers are associated with a common imaging system, wherein separate optical images of the defined planes of the lasers that are arranged around a common optical axis of the imaging system are generated as closely adjacent laser spots on the target.

* * * * *